(12) United States Patent
Zhou et al.

(10) Patent No.: US 9,066,426 B2
(45) Date of Patent: Jun. 23, 2015

(54) TRANSPARENT CONDUCTIVE FILM

(71) Applicant: NANCHANG O-FILM TECH. CO., LTD., Jiangxi (CN)

(72) Inventors: Fei Zhou, Jiangxi (CN); Miaoqian Cao, Jiangxi (CN)

(73) Assignee: Nanchang O-Film Tech. Co., Ltd., Jiangxi (CN)

( * ) Notice: Subject to any disclaimer, the term of this patent is extended or adjusted under 35 U.S.C. 154(b) by 207 days.

(21) Appl. No.: 13/985,922

(22) PCT Filed: Jul. 6, 2013

(86) PCT No.: PCT/CN2013/078940
§ 371 (c)(1),
(2) Date: Aug. 16, 2013

(87) PCT Pub. No.: WO2014/153897
PCT Pub. Date: Oct. 2, 2014

(65) Prior Publication Data
US 2014/0290984 A1    Oct. 2, 2014

(30) Foreign Application Priority Data
Mar. 28, 2013  (CN) .................. 2013 2 0149124 U

(51) Int. Cl.
*G06F 3/044*    (2006.01)
*H05K 1/02*    (2006.01)
(52) U.S. Cl.
CPC ............. *H05K 1/0296* (2013.01); *G06F 3/044* (2013.01); *G06F 2203/04112* (2013.01); *H05K 1/0287* (2013.01); *H05K 2201/0108* (2013.01); *H05K 2201/09681* (2013.01)

(58) Field of Classification Search
CPC .......... G06F 3/044; G06F 2203/04112; H05K 1/0296; H05K 1/0287; H05K 2201/09681; H05K 2201/0108; H05K 1/092
See application file for complete search history.

(56) References Cited

U.S. PATENT DOCUMENTS

| | | | |
|---|---|---|---|
| 8,508,680 B2* | 8/2013 | Geaghan et al. | 349/12 |
| 8,994,680 B2* | 3/2015 | Lai et al. | 345/173 |
| 2009/0085885 A1* | 4/2009 | Wu et al. | 345/173 |
| 2009/0219257 A1* | 9/2009 | Frey et al. | 345/173 |
| 2009/0219258 A1* | 9/2009 | Geaghan et al. | 345/173 |
| 2013/0169557 A1* | 7/2013 | Kim | 345/173 |
| 2014/0191978 A1* | 7/2014 | Ng et al. | 345/173 |
| 2014/0198264 A1* | 7/2014 | Gao et al. | 349/12 |
| 2014/0216804 A1* | 8/2014 | Yang et al. | 174/268 |

(Continued)

*Primary Examiner* — Patrick F Marinelli
(74) *Attorney, Agent, or Firm* — Rosenberg, Klein & Lee

(57) ABSTRACT

A transparent conductive film includes a substrate, a transparent conductive layer, a lead electrode, and a first connecting wire, the substrate includes a first region and a second region located on the edge of the substrate; the transparent conductive layer is embedded in the first region, the lead electrode is formed on the second region; first connecting wire is formed on the substrate and located between the transparent conductive layer and the lead electrode, thereby the conductive material of the first conductive mesh and that of second conductive mesh are electrically connected; the first connecting is arranged between the transparent conductive layer and the lead electrode for electrically connecting the transparent conductive layer and the lead electrode, which can enhance the electrical connection strength between the transparent conductive layer and the lead electrode, such that the conductivity of the conductive film is great, and the yield is improved.

11 Claims, 11 Drawing Sheets

(56) References Cited

U.S. PATENT DOCUMENTS

| | | | |
|---|---|---|---|
| 2014/0218636 A1* | 8/2014 | Gao | 349/12 |
| 2014/0218637 A1* | 8/2014 | Gao et al. | 349/12 |
| 2014/0284082 A1* | 9/2014 | Zhou | 174/251 |
| 2014/0290995 A1* | 10/2014 | Gao et al. | 174/258 |
| 2014/0293152 A1* | 10/2014 | Gao et al. | 349/12 |
| 2014/0327842 A1* | 11/2014 | Tang et al. | 349/12 |

* cited by examiner

TRANSPARENT CONDUCTIVE FILM

FIELD OF THE INVENTION

The present invention relates to a transparent conductive film.

BACKGROUND OF THE INVENTION

The touch screen also known as "touchscreen" or "touch panel", which is an induction type liquid crystal display system having a capable of receiving an input signal of contact and the like, it can be used to replace the mechanical button panel, and create a vivid audio and video effects by a liquid crystal display.

Currently, the conductive layer is an indispensable part of the touch screen. The conductive layer of the conventional touch screen is usually made of Indium Tin Oxides (ITO). The processes of coating, patterning and electrode silver lead producing are always inevitably needed when preparing the ITO layer. The etching of the ITO film is also needed when patterning the ITO, such a conventional production process is complex and lengthy, the conductivity of the conductive layer is poor, such that the yield is not high.

SUMMARY OF THE INVENTION

One object of the present invention is to provide a transparent conductive film having good conductivity and high yield.

A transparent conductive film includes:

a substrate includes a first region and a second region located on the edge of the substrate;

a transparent conductive layer formed on the first region of the substrate, the transparent conductive layer includes a first conductive mesh with conductive material;

a lead electrode formed on the second region of the substrate, the lead electrode includes a second conductive mesh with conductive material; and a first connecting wire formed on the substrate and located between the transparent conductive layer and the lead electrode, the conductive material of the first conductive mesh and the conductive material of second conductive mesh are electrically connected via the first connecting wire.

In one embodiment includes a transition section extended from the edge of the first conductive mesh, the transition section is located on the second region, the transition section is arranged between the first conductive mesh and the first connecting wire, the transition section includes a third conductive mesh with conductive material; a density of the lines of the mesh of the third conductive mesh is greater than or equals to a density of the lines of the mesh of the first conductive mesh.

In one embodiment, both the densities of the lines of the mesh of the first conductive mesh and the third conductive mesh are smaller than the density of the lines of the mesh of the second conductive mesh.

In one embodiment, the transition section includes a second connecting wire, the third conductive mesh is electrically connected to the first conductive mesh via the second connecting wire, the third conductive mesh is electrically connected to the second conductive mesh via the first connecting wire, the length of the second connecting wire is longer than the length of the first connecting wire.

In one embodiment, the substrate defines a trench with a pre-set shape, the conductive material of the transparent conductive layer, the lead electrode and the first connecting wire are correspondingly received in the trench, respectively.

In one embodiment, a ratio of the depth and the width of the trench is greater than or equals to 1, a width of the trench is smaller than or equals to 10 μm.

In one embodiment, the lead electrode protrudes from a surface of the second region.

In one embodiment, the lead electrode is formed on a surface of the second region by inkjet printing.

In one embodiment, a minimum width of the lead electrode ranges from 2 μm to 20 μm, a height of the lead electrodes ranges from 5 μm to 10 μm.

In one embodiment, the substrate further includes a substrate layer, the substrate layer is attached to a side of the substrate, both the first region and the second region are located on the substrate layer.

In one embodiment, the transparent conductive film further includes a shading layer, wherein the shading layer is located on the edge of the substrate, the lead electrode is formed on the surface of the substrate layer far away from the shading layer.

In one embodiment, a width of the shading layer ranges from 1 mm to 5 mm.

In one embodiment, the shapes of the mesh of the first conductive mesh, the second conductive mesh and/or the third conductive mesh are regular mesh or random mesh.

In one embodiment, the transparent conductive layer, the lead electrode and the first connecting wire are made of material selected from the group consisting of gold, silver, copper, aluminum, nickel, and zinc or an alloy thereof.

In one embodiment, the substrate is made of material selected from the group consisting of polyethylene terephthalate, polybutylene terephthalate, polymethyl methacrylate, polycarbonate plastic, and glass.

In one embodiment, the transparent conductive film further includes an alignment mark disposed on the substrate.

In the transparent conductive film, the transparent conductive layer is embedded in the first region of the substrate, the lead electrode is formed on the second region of the edge of the substrate, the first connecting wire is arranged between the transparent conductive layer and the lead electrode, such that the conductive material of the first conductive mesh and the conductive material of the second conductive mesh are electrically connected via the first connecting wire. The transparent conductive layer is formed by embedding the first conductive mesh on the first region of the substrate, and then the lead electrode is formed by arranging the second conductive mesh on the second region, besides the first connecting is arranged between the transparent conductive layer and the lead electrode, the transparent conductive layer and the lead electrode are electrically connected via the first connecting wire, which can improve the electrical connection strength between the transparent conductive layer and the lead electrode, such that the conductivity of the conductive film is good, and the yield is improved.

DETAILED DESCRIPTION OF THE EMBODIMENTS

The present disclosure are further described by the following specification and drawing.

Figure 1:
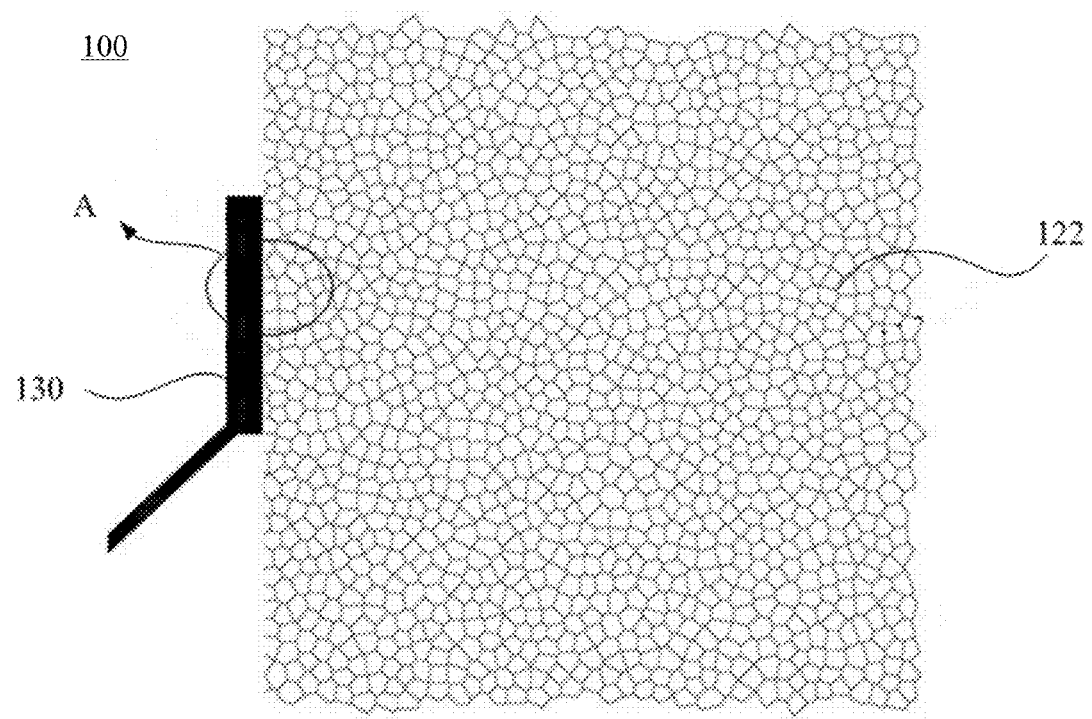
FIG. 1 is a schematic, plane view of a first embodiment of a transparent conductive film.
Figure 2:
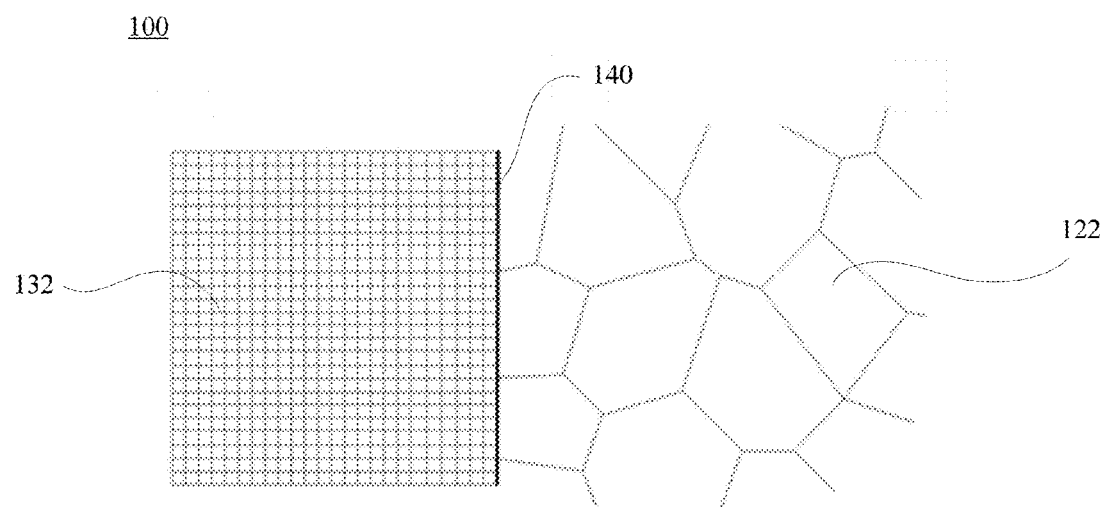
FIG. 2 is a schematic, enlarged view of a circled portion A shown in FIG. 1.
Figure 3:
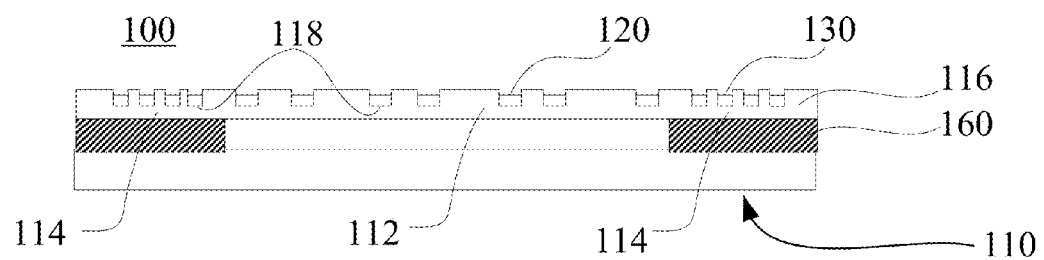
FIG. 3 is schematic, cross-sectional view of the transparent conductive film of FIG. 1 shown from another aspect.

A first embodiment is shown in FIG. 1, FIG. 2 and FIG. 3, a transparent conductive film 100 includes a substrate 110, a transparent conductive layer 120, a lead electrode 130, and a first connecting wire 140. The substrate 110 includes a first region 112 and a second region 114 located on the edge of the substrate 110; the transparent conductive layer 120 is formed on the first region 112; the lead electrode 130 is formed on the second region 114, the first connecting wire 140 is formed on the substrate 110 and located between the transparent conductive layer 120 and the lead electrode 130. The transparent conductive layer 120 includes a first conductive mesh 122 with conductive material; the lead electrode 130 includes a second conductive mesh 132 with conductive material. The conductive material of the first conductive mesh 122 is electrically connected to the conductive material of the second conductive mesh 132 via the first connecting wire 140. Specifically it is shown in FIG. 3, the first region 112 is located in a middle region above the substrate 110, the second region 114 is located on an edge region on two sides of the substrate 110.

In the transparent conductive film 100, the transparent conductive layer 120 is embedded in the first region 112 of the substrate 110, the lead electrode 130 is formed on the second region 114 of the edge of the substrate 110, the first connecting wire 140 is arranged between the transparent conductive layer 120 and the lead electrode 130, thus the conductive material of the first conductive mesh 122 and the conductive material of second conductive mesh 132 are electrically connected via the first connecting wire 140.

The transparent conductive layer 120 is formed by embedding the conductive material in the first region 112 of the substrate 110, and then the lead electrode 130 is formed by laying the second conductive mesh 132 on the second region 114. Meanwhile, the first connecting wire 140 is arranged between the between the transparent conductive layer 120 and the lead electrode 130, the transparent conductive layer 120 and the lead electrode 130 are electrically connected via the first connecting wire 140, which can improve the electrical connection strength between the transparent conductive layer 120 and the lead electrode 130, such that the conductivity of the conductive film is good, and the yield is improved.

Referring to the FIG. 2, in the illustrated embodiment, a virtual boundary line is formed on a portion of the transparent conductive layer 120 connecting to the lead electrode 130, the first connecting wire 140 is arranged on the boundary line, such that the conductive material of the first conductive mesh 122 and the conductive material of the second conductive mesh 132 are electrically connected.

The transparent conductive layer 120, the lead electrode 130 and the first connecting wire 140 are made of material selected from the group consisting of gold, silver, copper, aluminum, nickel, and zinc or an alloy consisted of at least two of gold, silver, copper, aluminum, nickel, and zinc. It is to be understood that, the transparent conductive layer 120 can be made of any conductor of electricity to have the corresponding function, such as carbon nanotubes, graphene, and conductive polymer and so on. In the illustrated embodiment, both the lead electrode 130 and the first connecting wire 140 are made of nano-silver.

The substrate 110 can be made of polyethylene terephthalate. In alternative embodiments, the substrate 110 may also be made of other material, such as polyethylene terephthalate, polybutylene terephthalate, polymethyl methacrylate, polycarbonate plastic and glass and so on, preferably a transparent insulating material.

Figure 4:
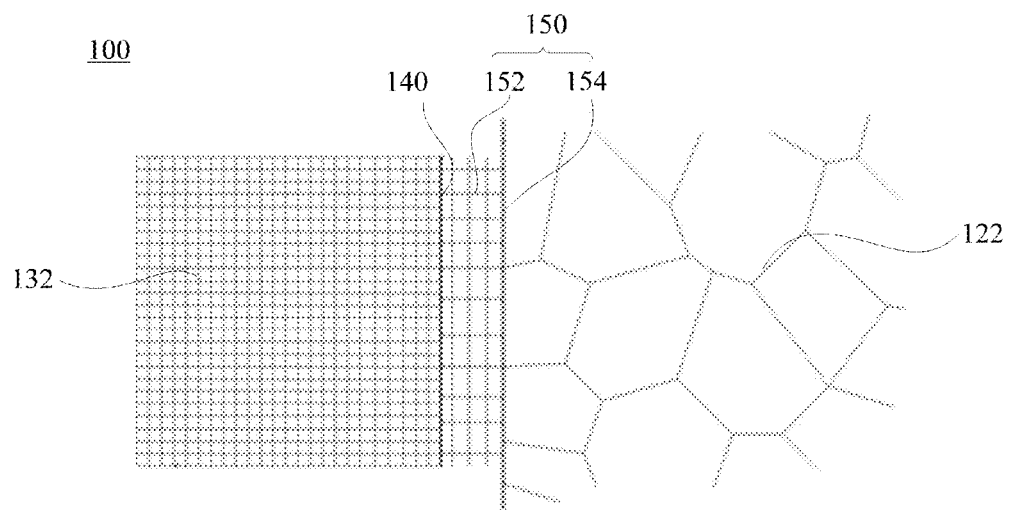
FIG. 4 is a schematic, plane view of a second embodiment of a transparent conductive film.

Referring to a second embodiment shown in FIG. 4, the transparent conductive film 100 further includes a transition section 150 extended from the edge of the first conductive mesh 122, the transition section 150 is located on the second region 114, the transition section 150 is arranged between the first conductive mesh 122 and the first connecting wire 140, the transition section 150 includes a third conductive mesh 152 with conductive material; the density of the lines of the mesh of the third conductive mesh 152 is greater than that of the first conductive mesh 112. The line of the mesh is formed by the arranging the conductive material, i.e. the density of the lines of the mesh equals to the intensive of the conductive material. The third conductive mesh 152 is extended from the first conductive mesh 112, the first conductive mesh 112 is connected to the first connecting wire 140 via the third conductive mesh 152. The density of the lines of the mesh of the third conductive mesh 152 is greater than that of the first conductive mesh 112, thus more conductive material of the first conductive mesh 122 in boundary line is connected to the first connecting wire 140, the connection strength between the transparent conductive layer 120 and the lead electrode 130 is improved, the conductivity of the conductive film is much better.

In order to further ensure the connection of the conductive material of the lead electrode 130 to the sufficient conductive material of the transparent conductive layer 120, both the densities of the lines of the mesh of the first conductive mesh 122 and the third conductive mesh 152 are configured to be smaller than that of the second conductive mesh 132.

Referring to a second embodiment shown in FIG. 4, the transition section 150 further includes a second connecting wire 154. The third conductive mesh 152 is electrically connected to the first conductive mesh 122 via the second connecting wire 154. The third conductive mesh 152 is electrically connected to the second conductive mesh 132 via the first connecting wire 140. The length of the second connecting wire 154 is greater than that of the first connecting wire 140. The second connecting wire 154 is arranged between the third conductive mesh 152 and the first conductive mesh 122, and the length of the second connecting wire 154 is greater than that of the first connecting wire 140, thus the second connecting wire 154 is contacted with much more of the conductive material of the first conductive mesh 122, thereby ensuring that sufficient conductive material of the first conductive mesh 122 is electrically connected to the conductive material of the third conductive mesh 152, the third conductive mesh 152 is electrically connected to the second conductive mesh 132 via the first connecting wire 140. Therefore the connection strength between the transparent conductive layer 120 and the lead electrode 130 are further improved, and the conductivity of the conductive film is further improved.

Referring to a first embodiment shown in FIG. 2 and a second embodiment shown in FIG. 4, the shape of the mesh of the first conductive mesh 122 is shown as random mesh. The first conductive mesh 122 includes a plurality of first mesh cells, when the transparent conductive film 100 is bonded to other display devices, in order to avoid the generation of moire fringes, at least two of the cycles of the first mesh cell are different, i.e. the shape of the first conductive mesh 122 is random mesh, the first mesh cells are distributed at each angle in the transparent conductive layer 120. The mesh cycle is the size of each mesh cell. Specifically, the random mesh can be formed by the cyclical splicing of the partial random mesh cells, i.e. the whole random mesh includes a plurality of partial random mesh cells, the size of the partial random mesh cell is bigger than 1 mm.

The moire fringe is an optical phenomenon, which is a visual effect formed by two lines or two objects being interfered at a constant angle and frequency, when the two lines or two objects could not be distinguished by eye, only the interference pattern can be seen, this optical phenomenon is moire fringe. The shape of the first mesh cell can be rhombus, rectangle, parallelogram, curved quadrilateral or polygonal, the curved quadrilateral has four curved sides, two opposite curved sides have the same shape and are in the same direction.

Figure 5:
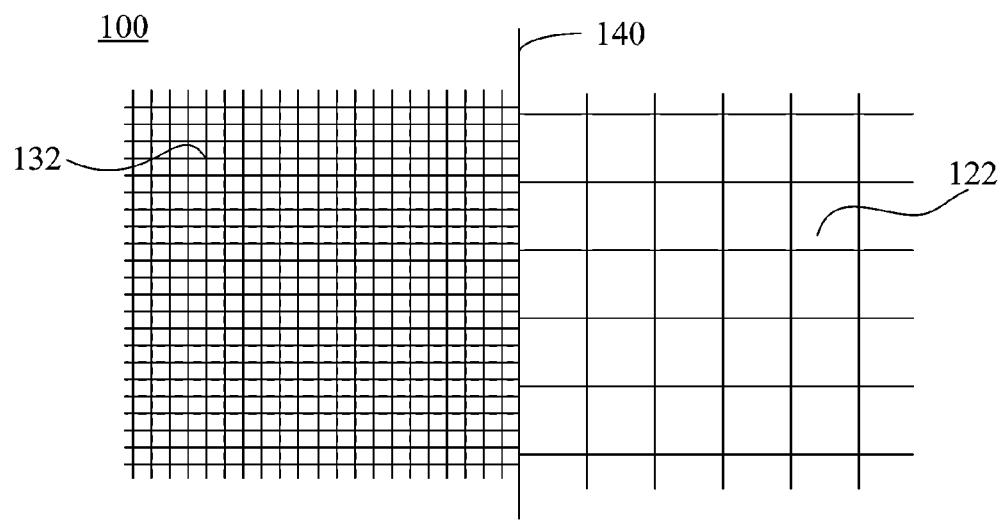
FIG. 5 is a schematic, plane view of a third embodiment of a transparent conductive film.
Figure 6:
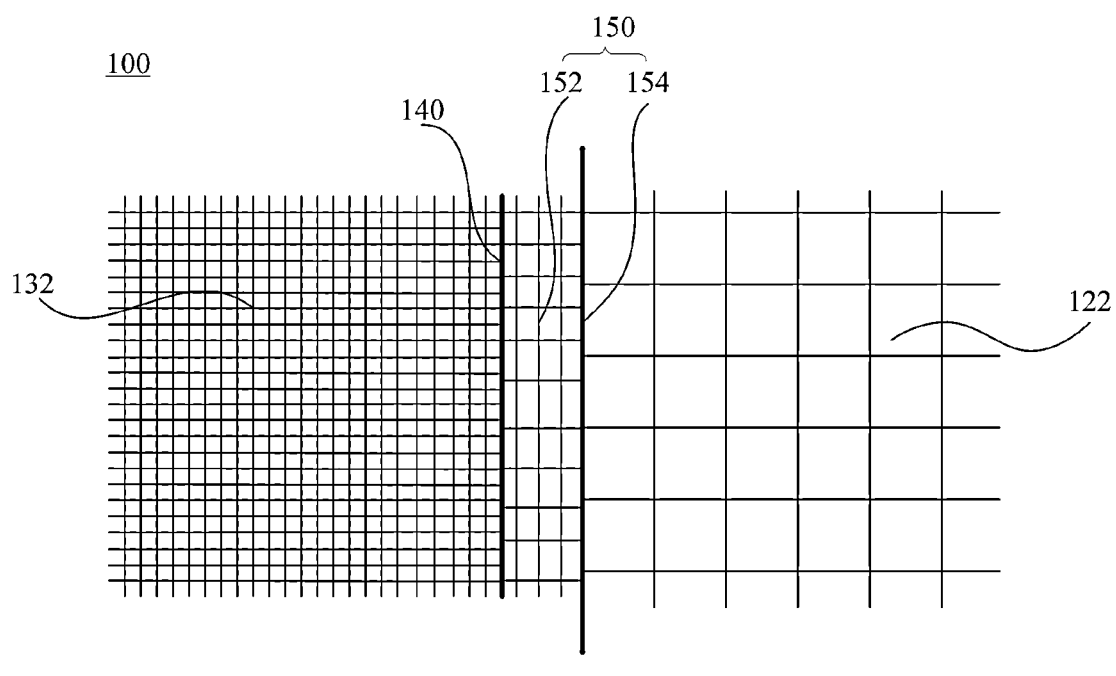
FIG. 6 is a schematic, plane view of a fourth embodiment of a transparent conductive film.

Referring to a third embodiment shown in FIG. 5 and a fourth embodiment shown in FIG. 6, the shape of the first conductive mesh 122 is regular mesh, i.e. all the mesh cycles of the first mesh cells of the first conductive mesh 122 are the same. Accordingly, when the transparent conductive film 100 is bonded to other display devices, especially for device display screen with a small display, the phenomenon of the displaying picture being disturbance is avoided.

Referring to a second embodiment shown in FIG. 4, the shape of the second conductive mesh 132 is regular mesh, i.e. the second conductive mesh 132 includes a plurality of second mesh cells, all the mesh cycles of the second mesh cells of the second conductive mesh 132 are the same, the shape of the third conductive mesh 152 is regular mesh, i.e. the third conductive mesh 152 includes a plurality of third mesh cells, all the mesh cycles of the third mesh cells of the third conductive mesh 152 are the same. The mesh cycle is the size of each of the mesh cell. Accordingly, both the second conductive mesh 132 and the third conductive mesh 152 are regular mesh, which may improve the stability of the conductivity of the conductive film, i.e. the conductivity of the conductive film is improved, and the production process is simple, the convenience of the connection is improved, the cost is saved. It is to be noted that, the shapes of the second conductive mesh 132 and the third conductive mesh 152 can be random mesh, i.e. the mesh cycles of the second mesh cells of the second conductive mesh 132 and that of the third mesh cells of the third conductive mesh 152 can be different.

The shape of the second mesh cell and the third mesh cell can be rhombus, rectangle, parallelogram, curved quadrilateral or polygonal, the quadrilateral curved has four curved sides, two opposite curved sides have the same shape and are in the same direction.

Referring to a first embodiment shown in FIG. 3, the substrate 110 defines a trench 118 with a pre-set shape, the conductive material of the transparent conductive layer 120, the lead electrode 130 and the first connecting wire 140 are correspondingly received in the trench 118, respectively. Specifically, the substrate 110 is imprinted by using a mold to form the trench 118 on a surface thereof, the trench 118 correspondingly includes a first trench, a second trench and a third trench. The first trench is defined on the first region 112, both the second trench and the third trench are defined on the second region 114, the third trench is defined between the first trench and the second trench, i.e. the third trench is defined between the transparent conductive layer 120 and the lead electrode 130, the conductive material is filled in the first trench and then sintered to form the first conductive mesh 122, thereby forming the transparent conductive layer 120, the conductive material is filled in the second trench and then sintered to form the second conductive mesh 132, thereby forming the lead electrode 130, the conductive material is filled in the third trench and then sintered to form the first connecting wire 140. The trench can be formed by imprinting in one-step, the imprinting mold is thus simplified, the production process is simple, and the cost is saved. Besides, the adhesive strength of the conductive material and the circuit board is enhanced; the conductivity of the conductive film is further improved.

Figure 10:
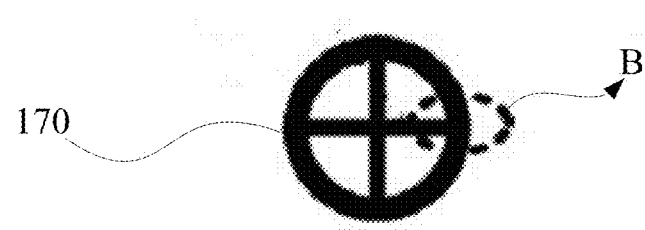
FIG. 10 is a schematic, plane view of a alignment mark of a transparent conductive film.
Figure 11:
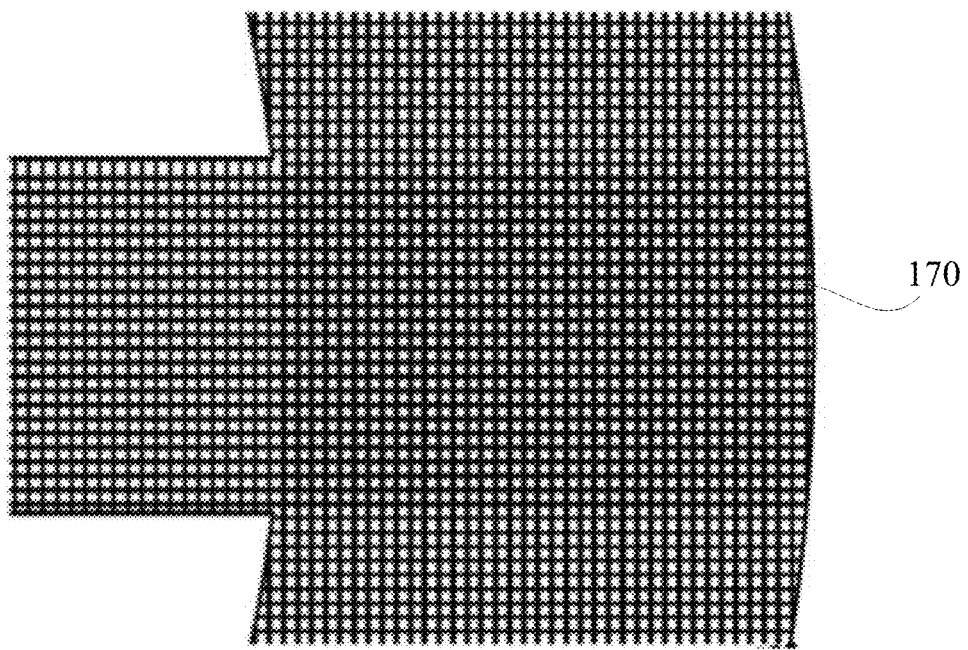
FIG. 11 is a schematic, enlarged view of a circled portion B shown in FIG. 10.

Referring to FIG. 10 and FIG. 11, in the illustrated embodiment, the transparent conductive film 100 further includes an alignment mark 170; the alignment mark 170 is arranged on the substrate 110. The conductive film can be accurately mounted on the touch screen by using the alignment mark 170, such that the conductivity of the conductive film is guaranteed. The alignment mark 170 can be composed by orthogonal mesh lines, the width of the line of the alignment mark 170 can be 2.2 μm, the mesh cycle can be 8 μm, a relative transmittance can be 53.5%.

Referring to FIG. 3, in the illustrated embodiment, in order to prevent the conductive material from breaking in the process of sintering and molding after filling in the trench 118, and in order to ensure the conductivity of the conductive film, the ratio of the depth and the width of the trench 118 can be reasonably configured to be not less than 1, the width of the trench 118 can be reasonably configured to be not more than 10 μm.

Figure 7:
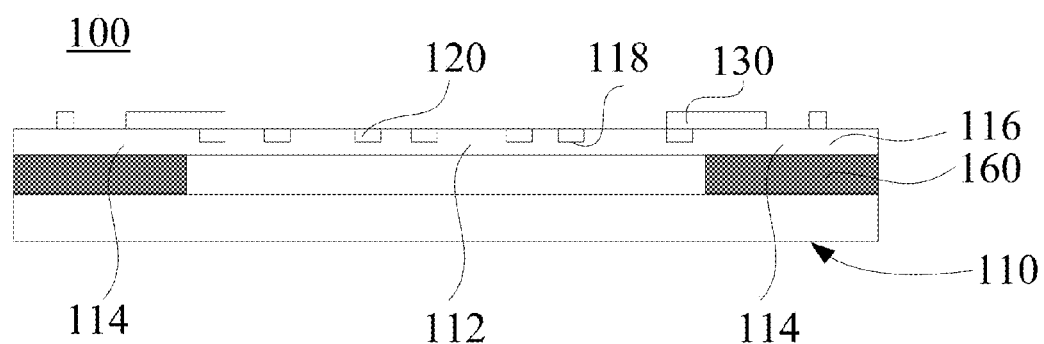
FIG. 7 is a schematic, cross-sectional view of a fifth embodiment of a transparent conductive film.

Referring to the example five shown in FIG. 7, the lead electrode 130 can protrude from on the surface of the second region 114. Specifically, the conductive material of the lead electrode 130 can be formed on a surface of the second region 114 by inkjet printing; thereby the lead electrode 130 is formed. Besides the ensured conductivity of the conductive film, the production process is simple, and the cost is saved.

Specifically, in order to ensure the conductivity of the conductive film, the width of the lead electrode 130 can be reasonably configured to range from 2 μm to 20 μm, the height of the lead electrodes can be reasonably configured to range from 5 μm to 10 μm.

Referring to the first example shown in FIG. 3, the substrate 110 includes a substrate layer 116, the substrate layer 116 is attached to a side of the substrate 110; both the first region 112 and the second region 114 are located on the substrate layer 116. The substrate layer 116 can be formed by coating and curing a jelly on the substrate 110, both the first region 112 and the second region 114 are located on the substrate layer 116. In the illustrated embodiment, which is located in the middle of the upper surface of substrate layer 116, i.e. the first region 112 is provided with the transparent conductive layer 120; in the edge of the upper surface the substrate layer 116, the second region 114 is provided with the lead electrode 130, the shading layer 160 is arranged on the lower surface of the second region 114 of the substrate layer 116. The substrate layer 116 can be used for insulation and molding. The substrate layer 116 can be made of OCA adhesive, UV adhesive, thermosetting adhesive or self-adhesive and so on.

Figure 8:
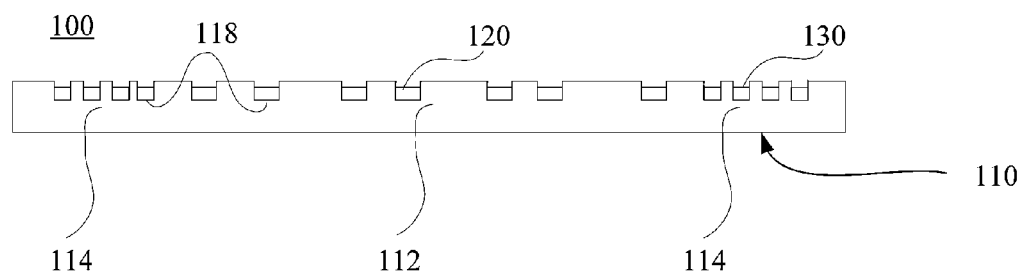
FIG. 8 is a schematic, cross-sectional view of a sixth embodiment of a transparent conductive film.
Figure 9:
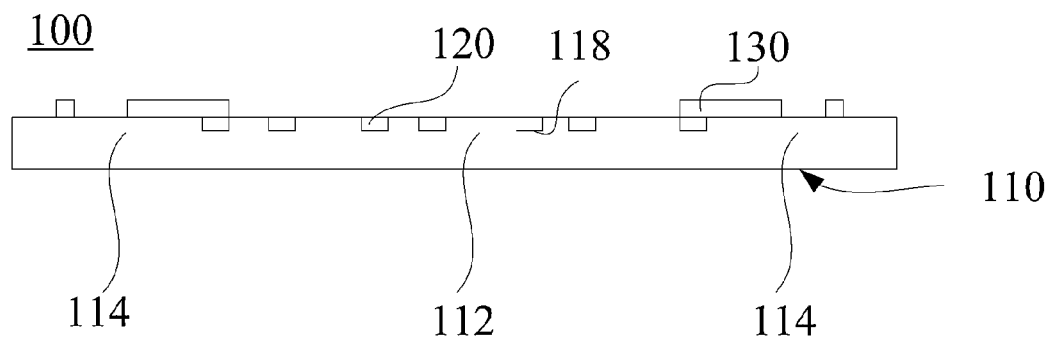
FIG. 9 is a schematic, cross-sectional view of a seventh embodiment of a transparent conductive film.

It is to be noted that, the first region 112 and the second region 114 can be arranged on a side of the substrate 110 directly, thus the substrate layer 116 is not needed. Referring to the example six shown in FIG. 8, both the first region 112 and the second region 114 are arranged on a side of the substrate 110 directly, and the lead electrode 130 is embedded in the second region 114. Referring to the example seven shown in FIG. 9, both the first region 112 and the second region 114 are arranged on a side of the substrate 110 directly, and the lead electrode 130 protrudes from the surface of the second region 114.

Referring to the first embodiment shown in FIG. 3, a shading layer 160 is further provided, which is located on the edge of the substrate 110, i.e. the black matrix layer 160 is located on the second region of the substrate layer 116, the lead electrode 130 is formed on the surface of the substrate layer 116 far away from the shading layer 160. The surface of the second region 114 of the substrate 110 corresponding to the substrate layer 116 is coated with the material of the shading layer 160 to form the substrate layer 116. Since the first region 112 having the transparent conductive layer 120 is a transparent area, which has a function of display, the edge of the substrate 110 (the second region 114) is provided with the matrix layer 160, which can increase the contrast of the display region, and the display effect is strengthened. The lead electrode 130 located in the matrix layer 160 is covered. The visual effect is improved in use. The matrix layer 160 can be made of the material of ink, in order to ensure the shading effect of the matrix layer 160, the width of the matrix layer 160 can be reasonably configured to range from 1 mm to 5 mm.

It should be understood that the descriptions of the examples are specific and detailed, but those descriptions can't be used to limit the present disclosure. Therefore, the scope of protective of the invention patent should be subject to the appended claims.

What is claimed is:

1. A transparent conductive film, comprising:
    a substrate comprising a first region and a second region located on the edge of the substrate;
    a substrate layer that is directly attached to a side of the substrate, and both the first region and the second region are located on the substrate layer;
    a transparent conductive layer formed on the first region of the substrate, the transparent conductive layer comprising a first conductive mesh with conductive material;
    a lead electrode formed on the second region of the substrate, the lead electrode comprising a second conductive mesh with conductive material;
    a first connecting wire formed on the substrate and located between the transparent conductive layer and the lead electrode, the conductive material of the first conductive mesh and the conductive material of second conductive mesh being electrically connected via the first connecting wire; and
    a shading layer located on the edge of the substrate and on a lower surface of the substrate layer such that the shading layer is between the substrate and the substrate layer,
    wherein the lead electrode is formed on an upper surface of the substrate layer,
    wherein the substrate layer defines a trench with a pre-set shape,
    wherein the conductive material of the transparent conductive layer, the lead electrode and the first connecting wire are correspondingly received in the trench, respectively,
    wherein a ratio of the depth and the width of the trench is greater than or equals to 1, and a width of the trench is smaller than or equals to 10 μm,
    wherein the lead electrode protrudes from the upper surface of the substrate layer in the second region.

2. The transparent conductive film according to claim 1, further comprising a transition section extended from the edge of the first conductive mesh, wherein the transition section is located on the second region, the transition section is arranged between the first conductive mesh and the first connecting wire, the transition section comprises a third conductive mesh with conductive material; a density of the lines of the mesh of the third conductive mesh is greater than or equals to a density of the lines of the mesh of the first conductive mesh.

3. The transparent conductive film according to claim 2, wherein both the densities of the lines of the mesh of the first conductive mesh and the third conductive mesh are smaller than the density of the lines of the mesh of the second conductive mesh.

4. The transparent conductive film according to claim 2, wherein the transition section comprises a second connecting wire, the third conductive mesh is electrically connected to the first conductive mesh via the second connecting wire, the third conductive mesh is electrically connected to the second conductive mesh via the first connecting wire, the length of the second connecting wire is longer than the length of the first connecting wire.

5. The transparent conductive film according to claim 2, wherein the shapes of the mesh of the first conductive mesh, the second conductive mesh and/or the third conductive mesh are regular mesh or random mesh.

6. The transparent conductive film according to claim 1, wherein the lead electrode is formed on a surface of the second region by inkjet printing.

7. The transparent conductive film according to claim 1, wherein a minimum width of the lead electrode ranges from 2 μm to 20 μm, a height of the lead electrodes ranges from 5μm to 10μm.

8. The transparent conductive film according to claim 1, wherein a width of the shading layer ranges from 1 mm to 5 mm.

9. The transparent conductive film according to claim 1, wherein the transparent conductive layer, the lead electrode and the first connecting wire are made of material selected from the group consisting of gold, silver, copper, aluminum, nickel, and zinc or an alloy thereof.

10. The transparent conductive film according to claim 1, wherein the substrate is made of material selected from the group consisting of polyethylene terephthalate, polybutylene terephthalate, polymethyl methacrylate, polycarbonate plastic, and glass.

11. The transparent conductive film according to claim 1, comprising an alignment mark disposed on the substrate.

* * * * *